(12) United States Patent
Tanaka

(10) Patent No.: US 9,790,592 B2
(45) Date of Patent: Oct. 17, 2017

(54) DECORATIVE ARTICLE HAVING BLACK HARD COATING FILM

(71) Applicants: CITIZEN HOLDINGS CO., LTD., Nishitokyo-shi, Tokyo (JP); CITIZEN WATCH CO., LTD., Nishitokyo-shi, Tokyo (JP)

(72) Inventor: Osamu Tanaka, Tokyo (JP)

(73) Assignee: CITIZEN WATCH CO., LTD., Nishitokyo-Shi, Tokyo (JP)

(*) Notice: Subject to any disclaimer, the term of this patent is extended or adjusted under 35 U.S.C. 154(b) by 52 days.

(21) Appl. No.: 14/779,375

(22) PCT Filed: Mar. 19, 2014

(86) PCT No.: PCT/JP2014/057539
§ 371 (c)(1),
(2) Date: Sep. 23, 2015

(87) PCT Pub. No.: WO2014/156884
PCT Pub. Date: Oct. 2, 2014

(65) Prior Publication Data
US 2016/0053371 A1 Feb. 25, 2016

(30) Foreign Application Priority Data
Mar. 28, 2013 (JP) .................. 2013-068677

(51) Int. Cl.
*C23C 16/27* (2006.01)
*C23C 16/26* (2006.01)
(Continued)

(52) U.S. Cl.
CPC ............ *C23C 16/26* (2013.01); *C23C 16/006* (2013.01); *C23C 16/513* (2013.01); *C23C 16/52* (2013.01)

(58) Field of Classification Search
USPC .......................... 427/577; 428/212, 408, 336
See application file for complete search history.

(56) References Cited

U.S. PATENT DOCUMENTS 4,877,677 A * 10/1989 Hirochi ............... C23C 14/0623
428/408
5,607,783 A * 3/1997 Onodera .................. G11B 5/72
428/408

(Continued)

FOREIGN PATENT DOCUMENTS

CN 101602273 A 12/2009
EP 0828014 A2 3/1998
(Continued)

OTHER PUBLICATIONS

International Search Report for PCT/JP2014/057539 dated Jun. 17, 2014.
(Continued)

*Primary Examiner* — Archene Turner
(74) *Attorney, Agent, or Firm* — Sughrue Mion, PLLC

(57) ABSTRACT

Provided is a decorative article including a black hard coating film which is excellently inhibited from suffering a deterioration of appearance quality such as a scratch due to use thereof, and which has excellent decorativeness. The decorative article according to the present invention is a decorative article including: a base; and a black hard coating film which is formed on the base, and which includes diamond-like carbon, wherein the hydrogen content of a surface, reverse to a surface closer to the base, of the black hard coating film is more than the hydrogen content of the surface, closer to the base, of the black hard coating film; and the hydrogen content of the surface, reverse to the surface closer to the base, of the black hard coating film is 30.0 to 75.0 atm %.

9 Claims, 9 Drawing Sheets

(51) Int. Cl.
*C23C 16/00* (2006.01)
*C23C 16/513* (2006.01)
*C23C 16/52* (2006.01)

(56) References Cited

U.S. PATENT DOCUMENTS

| | | | |
|---|---|---|---|
| 5,942,317 A * | 8/1999 | White | C23C 14/027 428/212 |
| 6,299,425 B1 * | 10/2001 | Hirano | F01C 21/0809 428/408 |
| 2006/0210833 A1 | 9/2006 | Saito et al. | |
| 2011/0268946 A1 * | 11/2011 | Fischer | C23C 30/00 428/217 |
| 2012/0064306 A1 | 3/2012 | Kang et al. | |
| 2012/0088701 A1 | 4/2012 | Suzuki et al. | |
| 2016/0017483 A1 | 1/2016 | Guimond et al. | |

FOREIGN PATENT DOCUMENTS

| | | |
|---|---|---|
| EP | 2441858 A1 | 4/2012 |
| JP | 59-197559 A | 11/1984 |
| JP | 4-80364 A | 3/1992 |
| JP | 8-217596 A | 8/1996 |
| JP | 11-92934 A | 4/1999 |
| JP | 2000-254923 A | 9/2000 |
| JP | 2001-213419 A | 8/2001 |
| JP | 2003-27214 A | 1/2003 |
| JP | 2003-230411 A | 8/2003 |
| JP | 2004279382 A | 10/2004 |
| JP | 2004-332111 A | 11/2004 |
| JP | 2005-002377 A | 1/2005 |
| JP | 2006-8853 A | 1/2006 |
| JP | 2009216622 A | 9/2009 |
| JP | 2010-228307 A | 10/2010 |
| JP | 2016-513181 A | 5/2016 |

OTHER PUBLICATIONS

Communication dated Nov. 2, 2016, from the State Intellectual Property Office of People's Republic of China in counterpart Application No. 201480018003.6.

Zulun Lin et al; "Cathode Electronics" National Defense Industry Press; Jan. 2013; (6 pages total).

Changqiong Zheng et al; "New Inorganic Materials" Science Press; Jan. 2003; (7 pages total).

Communication dated Nov. 23, 2016, from the European Patent Office in counterpart European Application No. 14774461.9.

Communication dated Sep. 13, 2016, from the Japanese Patent Office in counterpart Japanese application No. 2015-508381.

Communication dated Apr. 4, 2017 from the Japanese Patent Office in counterpart Application No. 2015-508381.

* cited by examiner

[Fig. 1]
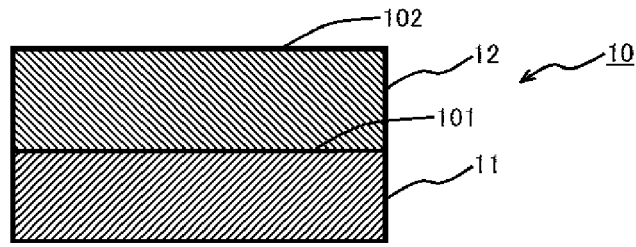
[Fig. 2]
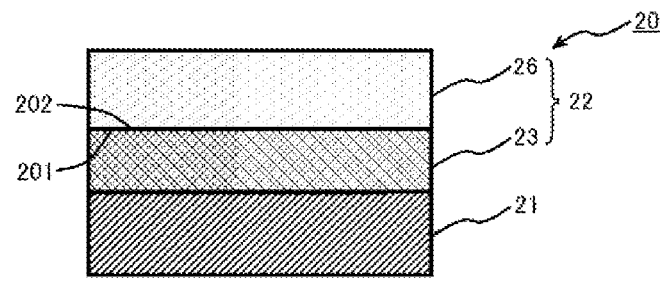
[Fig. 3]
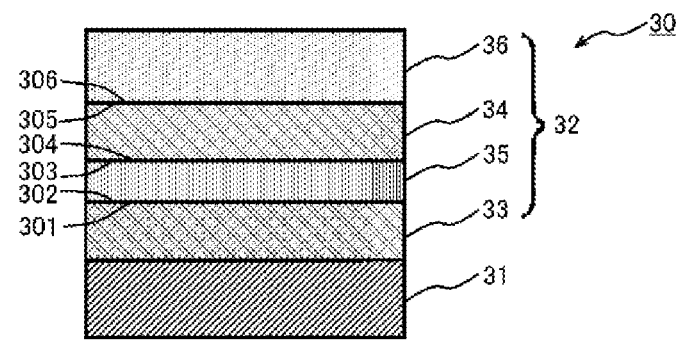
[Fig. 4]
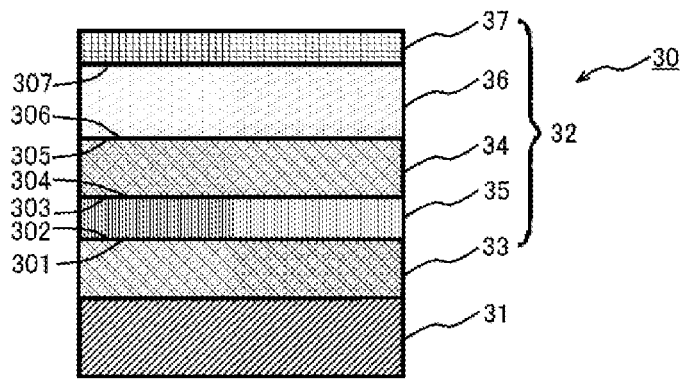

[Fig. 5]
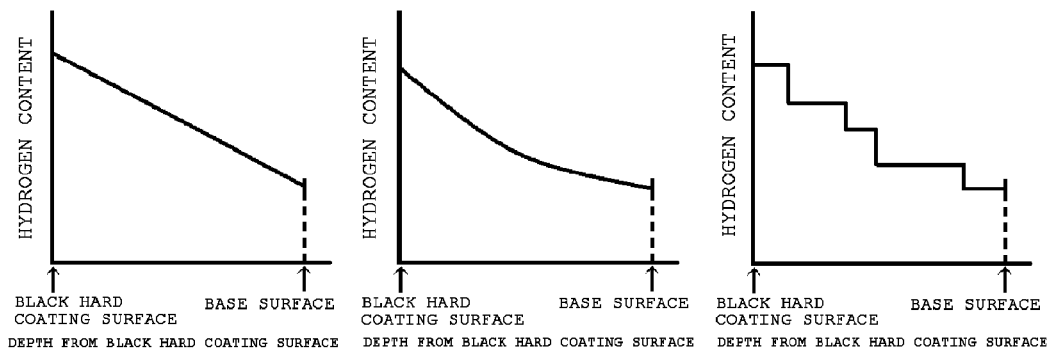
[Fig. 6]
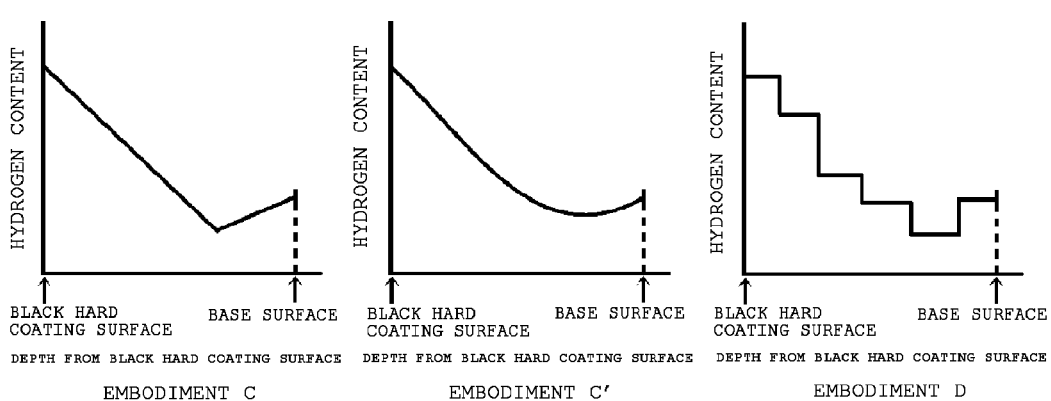

[Fig. 7]
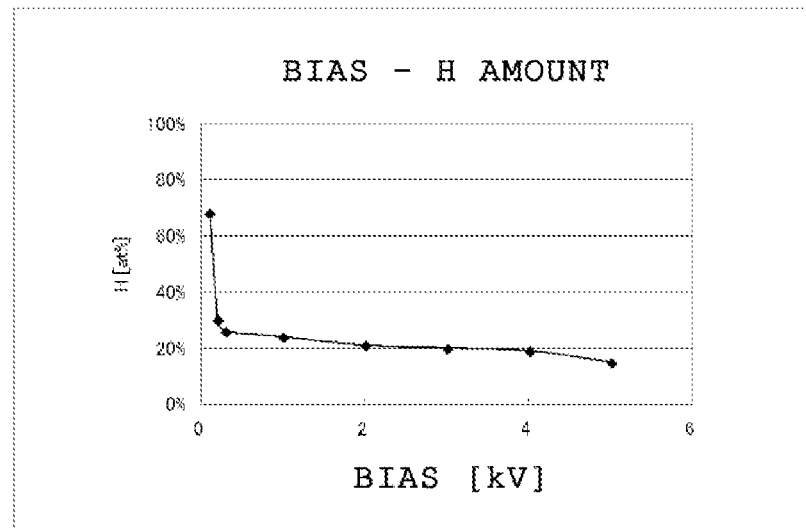
[Fig. 8]
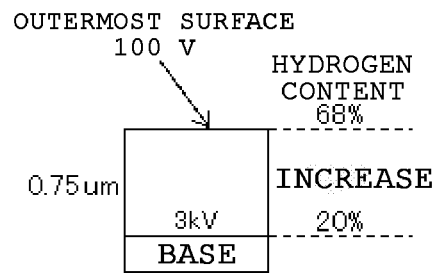
[Fig. 9]
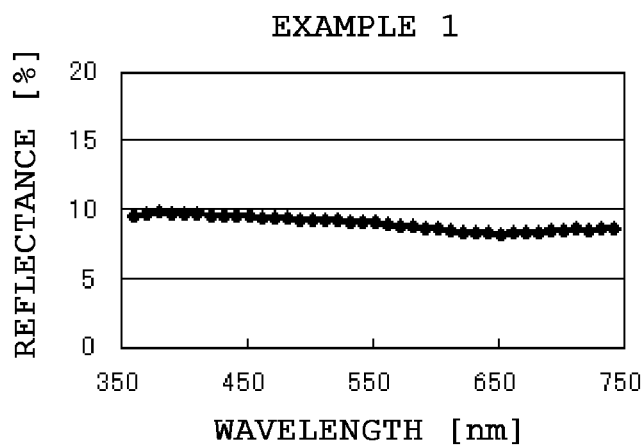

[Fig. 10]
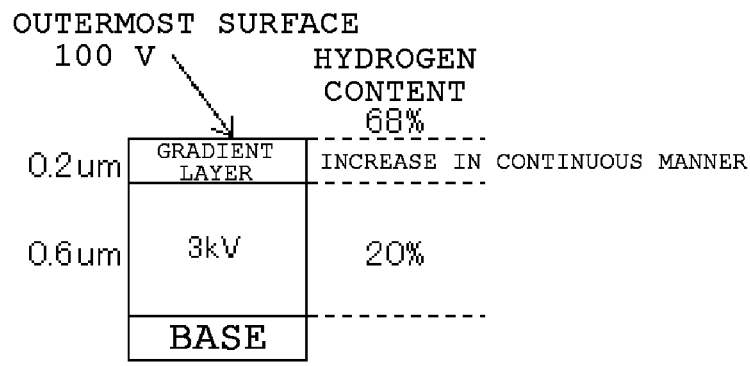
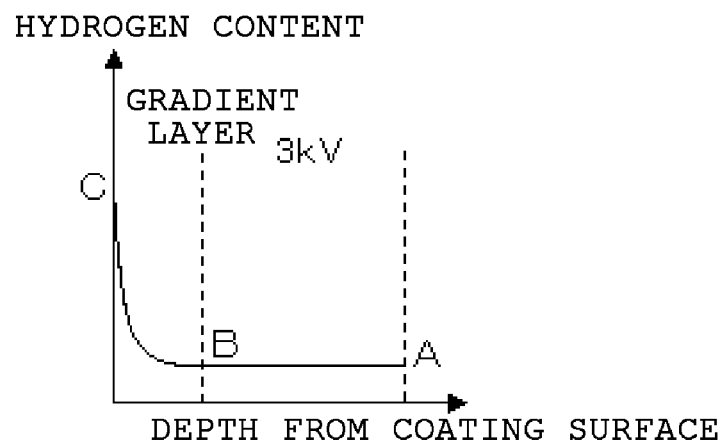
[Fig. 11]
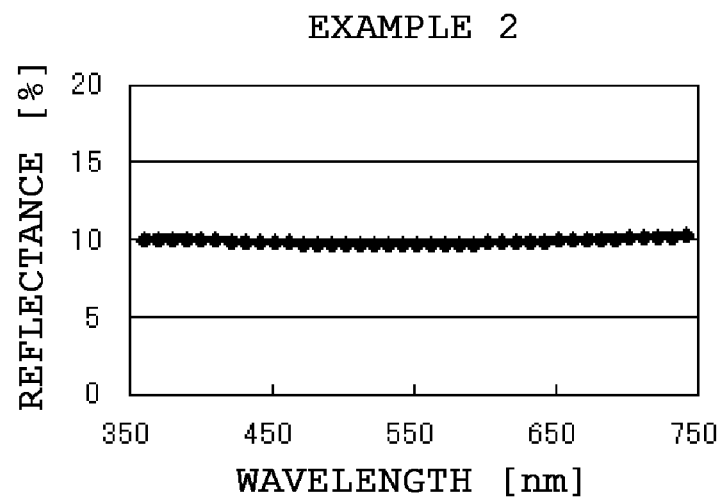

[Fig. 12]
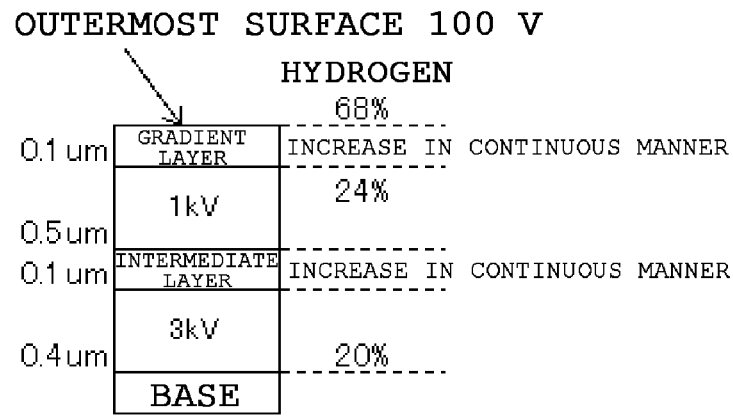
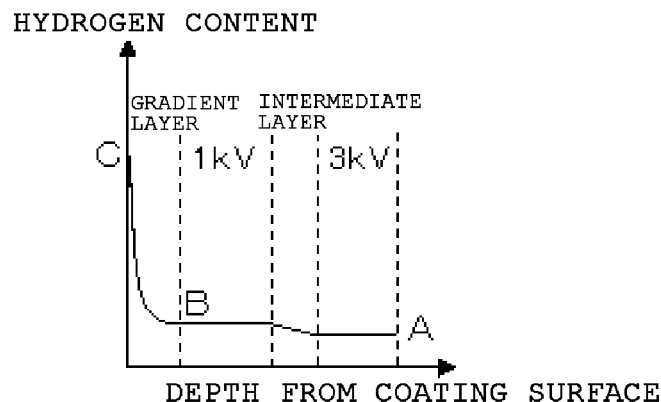
[Fig. 13]
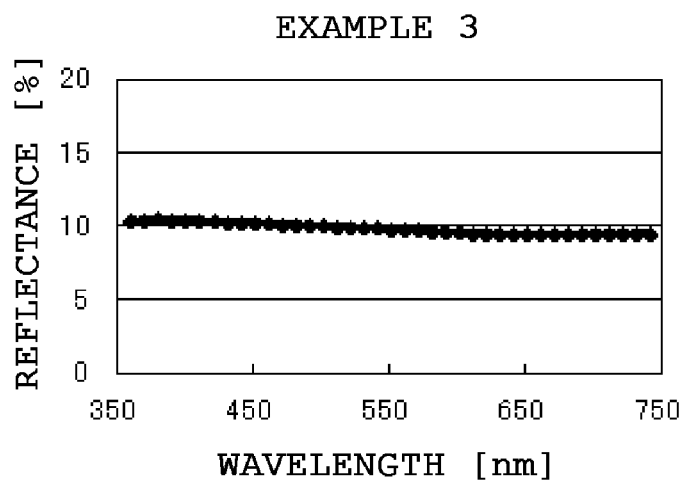

[Fig. 14]
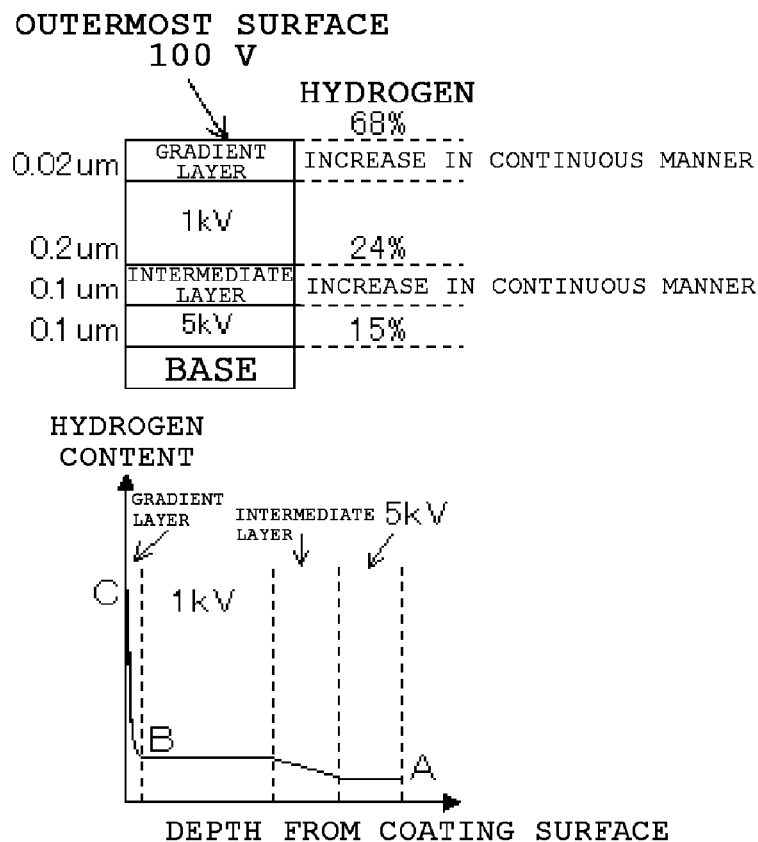
[Fig. 15]
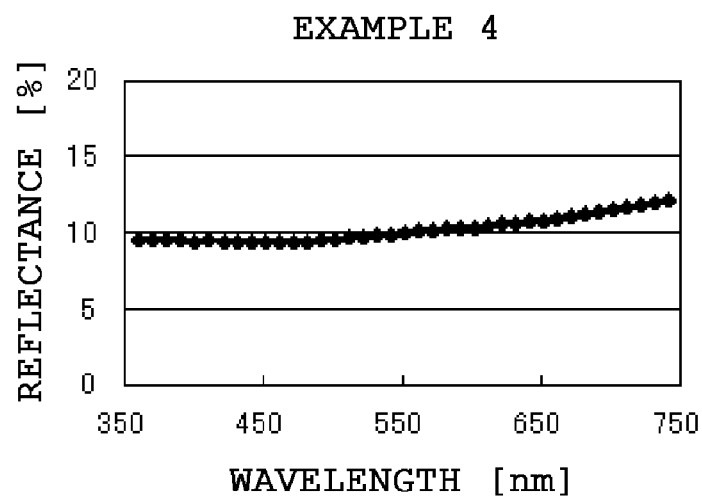

[Fig. 16]
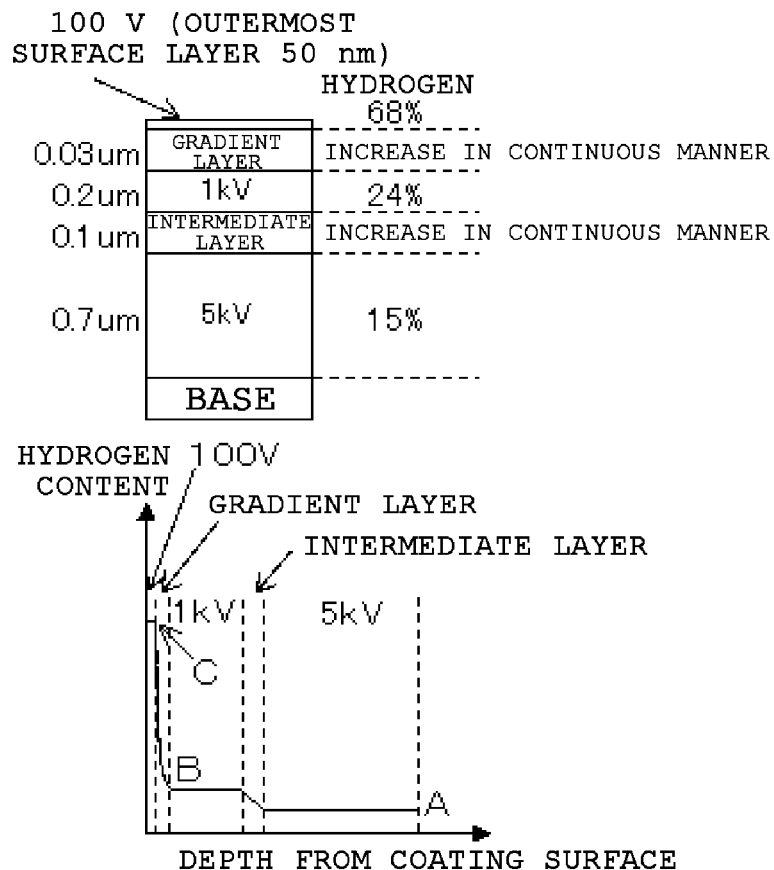
[Fig. 17]
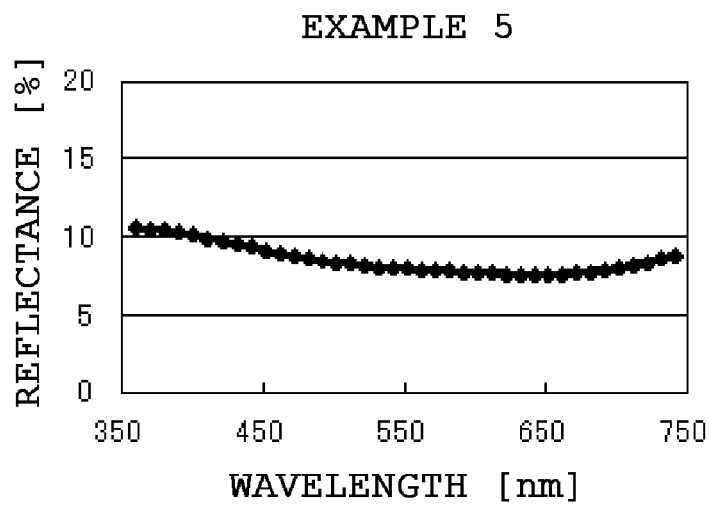

[Fig. 18]
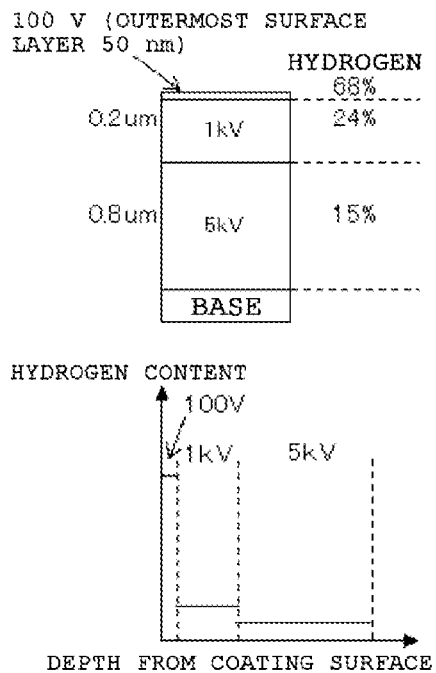
[Fig. 19]
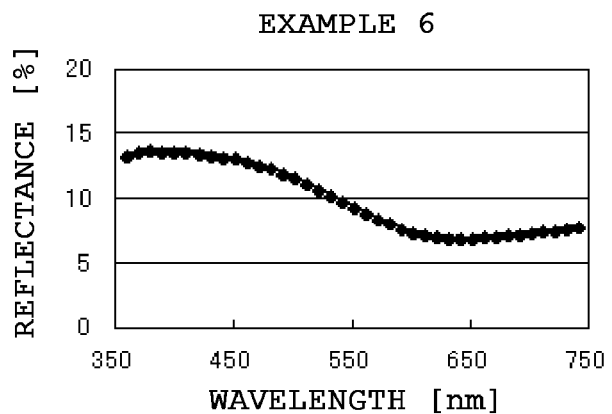
[Fig. 20]
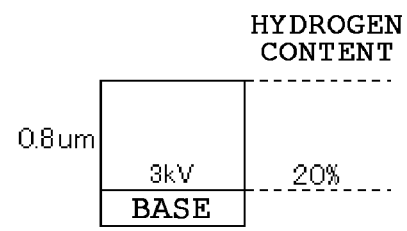

[Fig. 21]
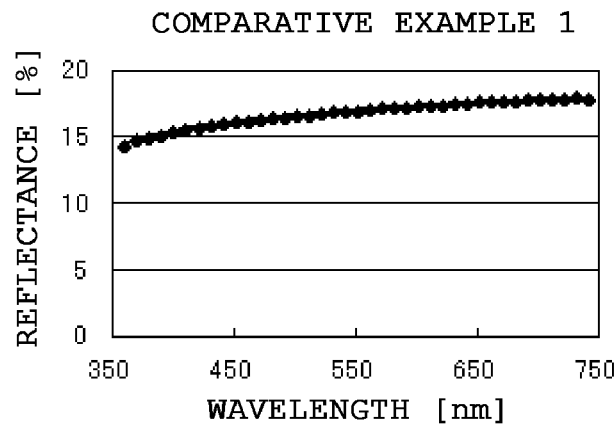
[Fig. 22]
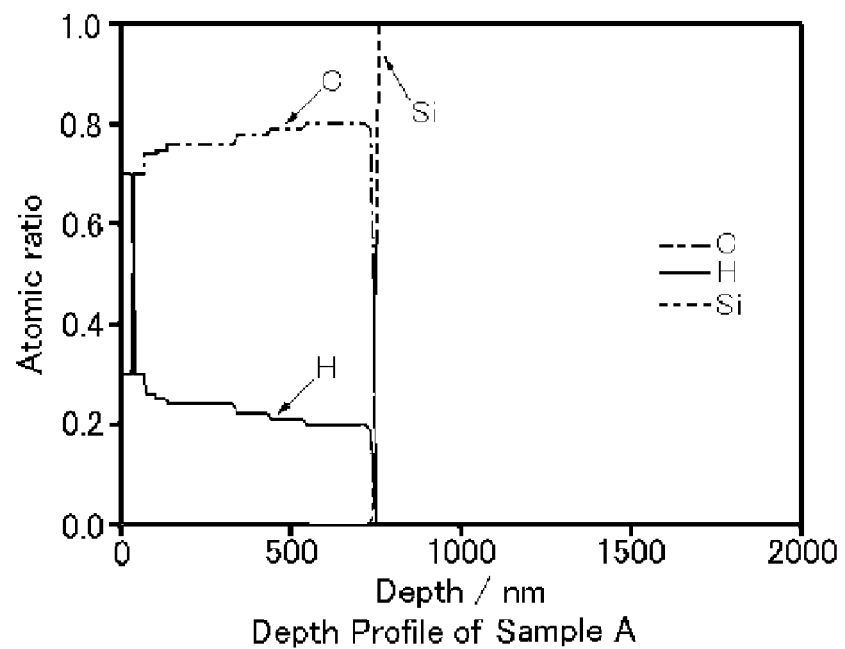
Depth Profile of Sample A

DECORATIVE ARTICLE HAVING BLACK HARD COATING FILM

CROSS REFERENCE TO RELATED APPLICATIONS

This application is a National Stage of International Application No. PCT/JP2014/057539 filed Mar. 19, 2014, claiming priority based on Japanese Patent Application No. 2013-068677, filed Mar. 28, 2013, the contents of all of which are incorporated herein by reference in their entirety.

TECHNICAL FIELD

The present invention relates to a decorative article having a black hard coating film.

BACKGROUND ART

Conventionally, stainless steel, Ti, Ti alloy, brass, and the like which are soft bases that are easily subjected to partial processing have been widely adopted in decorative articles such as exterior parts for timepieces, necklaces, pendants, and brooches. However, the decorative articles processed with the soft bases have had problems of deteriorations of appearance quality such as scratches due to use thereof, and various surface treatment technologies have been used as measures against the problems.

The above-mentioned exterior parts for timepieces have required high appearance quality and high decorativeness, and as an example of decoration therefor, a black coating film has been formed by a surface treatment technology.

An example of black coating films using surface treatment technologies is a nickel-phosphorus alloy coating film obtained by using a wet plating method (see Patent Literature 1). However, it has been impossible to solve the above-mentioned deteriorations of appearance quality due to scratches because the coating film itself is soft.

Other examples of black coating films include a diamond-like carbon (DLC) film formed by plasma polymerization treatment. The DLC film comprises carbon and has an amorphous structure including hybrid orbitals with an $sp^3$ structure and an $sp^2$ structure. In addition, more generally, 10 to 30 atomic % of hydrogen is contained in the film.

The DLC coating film is harder than a soft base such as stainless steel, Ti, Ti alloy, or brass used as a base for an exterior part for a timepiece or a decorative article and is excellently inhibited from suffering the above-mentioned deteriorations of appearance quality such as scratches due to use thereof (see Patent Literature 2).

CITATION LIST

Patent Literature

Patent Literature 1: Japanese Patent Laid-Open No. 2004-332111
Patent Literature 2: Japanese Patent Laid-Open No. 04-080364

SUMMARY OF INVENTION

Technical Problem

However, the appearance color tone of such a DLC coating film which is hard and excellent in scratch resistance is grayer than that of the above-mentioned nickel-phosphorus alloy coating film obtained by using a wet plating method and is susceptible to improvement in decorativeness. In addition, a blacker DLC coating film with decorativeness given higher priority has low hardness and is susceptible to improvement in scratch resistance. As described above, it may be considered that there is a trade-off relationship between the decorativeness and hardness of a black coating film, which are contrary to each other.

Accordingly, an objective of the present invention is to provide a decorative article including a black hard coating film which is excellently inhibited from suffering a deterioration of appearance quality such as a scratch due to use thereof, and which has excellent decorativeness.

Solution to Problem

The decorative article according to the present invention is a decorative article including: a base; and a black hard coating film which is formed on the base, and which comprises diamond-like carbon, wherein a hydrogen content of a surface, reverse to a surface closer to the base, of the black hard coating film is more than a hydrogen content of the surface, closer to the base, of the black hard coating film; and the hydrogen content of the surface, reverse to the surface closer to the base, of the black hard coating film is 30.0 to 75.0 atm %.

Advantageous Effects of Invention

The decorative article according to the present invention is hard, is less prone to degradation in appearance quality due to a scratch or the like, and has a black color tone with high decorativeness.

BRIEF DESCRIPTION OF DRAWINGS

FIG. 1 is a view for explaining a decorative article of the present invention.
FIG. 2 is a view for explaining a decorative article of the present invention.
FIG. 3 is a view for explaining a decorative article of the present invention.
FIG. 4 is a view for explaining a decorative article of the present invention.
FIG. 5 is a view for explaining a decorative article of the present invention.
FIG. 6 is a view for explaining a decorative article of the present invention.
FIG. 7 is a view showing a relationship between a bias and a hydrogen content.
FIG. 8 is a view schematically showing a decorative article produced in Example 1.
FIG. 9 is a view showing the measurement results of the spectral reflectance of the decorative article produced in Example 1.
FIG. 10 is a view schematically showing a decorative article produced in Example 2.
FIG. 11 is a view showing the measurement results of the spectral reflectance of the decorative article produced in Example 2.
FIG. 12 is a view schematically showing a decorative article produced in Example 3.
FIG. 13 is a view showing the measurement results of the spectral reflectance of the decorative article produced in Example 3.
FIG. 14 is a view schematically showing a decorative article produced in Example 4.

FIG. 15 is a view showing the measurement results of the spectral reflectance of the decorative article produced in Example 4.

FIG. 16 is a view schematically showing a decorative article produced in Example 5.

FIG. 17 is a view showing the measurement results of the spectral reflectance of the decorative article produced in Example 5.

FIG. 18 is a view schematically showing a decorative article produced in Example 6.

FIG. 19 is a view showing the measurement results of the spectral reflectance of the decorative article produced in Example 6.

FIG. 20 is a view schematically showing a decorative article produced in Comparative Example 1.

FIG. 21 is a view showing the measurement results of the spectral reflectance of the decorative article produced in Comparative Example 1.

FIG. 22 is a view showing the results of the RBS measurement of the decorative article produced in Example 1.

DESCRIPTION OF EMBODIMENTS

The present invention will be specifically explained below.

<Decorative Article>

The decorative article according to the present invention is a decorative article 10 including a base 11 and a black hard coating film 12 which is formed on the base 11, and which comprises diamond-like carbon (DLC), as illustrated in FIG. 1.

[Base]

The base used in the present invention is a base formed of a metal, ceramic, or plastic. Specific examples of metals (including alloys) include stainless steel, titanium, titanium alloy, copper, copper alloy, tungsten; stainless steel, titanium, and titanium alloy subjected to hardening treatment; and the like. These metals may be used singly or in combination of two or more kinds thereof. The shape of the above-described base is not limited.

[Black Hard Coating Film]

The black hard coating film comprises diamond-like carbon (DLC). The coating film comprising DLC is an amorphous film which contains carbon and hydrogen, and in which carbon having an $sp^3$ bond corresponding to a diamond structure and carbon having an $sp^2$ bond corresponding to a graphite structure coexist irregularly.

In the present invention, the hydrogen content of a surface 102, reverse to a surface 101 closer to the base, of the black hard coating film is more than the hydrogen content of the surface 101, closer to the base, of the black hard coating film (see FIG. 1). Mention can be specifically made of an embodiment in which a hydrogen content is increased with increasing a distance from the base, and for example, there are cases in which the hydrogen content is increased in a continuous manner such as a linear or curved manner with increasing the distance from the base, and in which the hydrogen content is increased in a discontinuous (intermittent) manner such as a stepwise manner with increasing the distance from the base. In the present invention, it is essential only to satisfy a requirement that the hydrogen content of the surface, reverse to the surface closer to the base, of the black hard coating film is more than the hydrogen content of the surface, closer to the base, of the black hard coating film, and an embodiment including a region in which a hydrogen content is decreased in a continuous or discontinuous (intermittent) manner with increasing a distance from the base may also be acceptable. As used herein, the phrase "with increasing a distance from a base" means the phrase "from a surface of the base toward the thickness direction of a black hard coating film, perpendicular to the base".

As described above, a region, closer to the base, of the black hard coating film has a low hydrogen content and high hardness whereas a region, reverse to the region closer to the base, of the black hard coating film has a high hydrogen content and a black color tone with high decorativeness. In the black hard coating film of the present invention, both of a black color tone and high hardness and scratch resistance can be achieved because a region with a high hydrogen content is formed above a region with a low hydrogen content.

The hydrogen content of the surface, reverse to the surface closer to the base, of the black hard coating film is 30.0 to 75.0 atm %, preferably 30.0 to 70.0 atm %. When the hydrogen content of the surface reverse to the surface closer to the base is in the above-described range, a black color tone with high decorativeness is obtained. In other words, a requirement that L* in Lab color space display, which is an index for a black color tone with high decorativeness, is 41 or less can be satisfied.

Furthermore, from the viewpoint of hardness, the hydrogen content of the surface, closer to the base, of the black hard coating film is less than the hydrogen content of the surface, reverse to the surface closer to the base, of the black hard coating film, and is preferably 0 to 20.0 atm %, more preferably 15.0 to 20.0 atm %.

The thickness of the black hard coating film is preferably 0.4 to 3.0 μm, more preferably 1.0 to 2.0 μm. When the thickness is in this range, both of a more preferred black color tone and still higher hardness and scratch resistance can be achieved.

(Gradient Layer)

The above-described black hard coating film preferably includes a gradient layer comprising DLC. The hydrogen content in the gradient layer is increased (for example, in a continuous manner) with increasing a distance from the base, and the hydrogen content of a surface, reverse to a surface closer to the base, of the gradient layer is preferably 30.0 to 75.0 atm %, more preferably 30.0 to 70.0 atm %.

The hydrogen content of the surface, closer to the base, of the gradient layer is preferably 0 to 20.0 atm %, more preferably 15.0 to 20.0 atm %.

When the hydrogen content is increased (for example, in a continuous manner) with increasing a distance from the base, interference fringes on the black hard coating film are inhibited from being seen, to result in a preferred appearance. When no interference fringes are seen, the measurement of spectral reflectances at wavelengths of 350 to 750 nm shows the low variations of the values, and for example, the difference between the maximum and minimum values of the spectral reflectances at wavelengths of 350 to 750 nm is 5.0% or less.

The thickness of the gradient layer is preferably 0.02 to 3.0 μm, more preferably 1.0 to 2.0 μm. When the thickness is in this range, interference fringes can be more inhibited from appearing.

(Low-Hydrogen-Content Layer)

It is preferable that the above-described black hard coating film further includes a low-hydrogen-content layer which is formed in a portion closer to the base than the gradient layer, and which comprises DLC. The hydrogen content in the low-hydrogen-content layer is preferably less than 30.0 atm %, more preferably 15.0 to 20.0 atm %.

When the low-hydrogen-content layer having a less hydrogen content and higher hardness than the gradient layer is formed on a side closer to the base, the hardness and scratch resistance of the entire black hard coating film are enhanced. In addition, interference fringes are inhibited from appearing because the low-hydrogen-content layer absorbs light. It is preferable that the hydrogen content of the entire low-hydrogen-content layer is less than the hydrogen content of the entire gradient layer.

The thickness of the low-hydrogen-content layer is preferably 0.1 to 1.0 μm, more preferably 0.2 to 0.5 μm, from the viewpoint of hardness and scratch resistance.

(Outermost Surface Layer)

It is preferable that the above-described black hard coating film further includes an outermost surface layer which is formed on a side, reverse to a side closer to the base, of the gradient layer, and which comprises DLC. The hydrogen content in the outermost surface layer is preferably an amount of ±10.0 atm %, more preferably an amount of ±5.0 atm %, with respect to the hydrogen content of the surface, reverse to the surface closer to the base, of the gradient layer, and is still more preferably equal to the hydrogen content of the surface, reverse to the surface closer to the base, of the gradient layer. The hydrogen content in the outermost surface layer is preferably 30 to 75 atm %, more preferably 35 to 70 atm %.

The formation of such an outermost surface layer on a gradient layer results in a black color tone with higher decorativeness.

The thickness of the outermost surface layer is preferably 0.01 to 0.1 μm, more preferably 0.01 to 0.05 μm, from the viewpoint of a color tone.

(Other Elements)

The layers which are used in the present invention and comprise DLC, i.e., the gradient layer, the low-hydrogen-content layer, and the outermost surface layer may further contain other elements such as F, Si, Ge, B, Al, Ti, V, Cr, Ni, Zr, Nb, Mo, Hf, Ta, and W. With respect to 100.0 atm % in total of carbon, hydrogen, and the other elements contained in the layers comprising DLC, 5.0 to 40.0 atm % in total of the other elements may be contained. When the other elements are contained, there can be expected effects such as a rise in hardness, improvement in adhesiveness between each layer and the base, reduction in friction coefficient, improvement in heat resistance, improvement in wear resistance, improvement in water repellency, and reduction in electrical resistance.

[Adhesion Layer]

In the decorative article of the present invention, an adhesion layer may be formed between the base and the above-described black hard coating film formed on the base. As a result, adhesiveness between the base and the black hard coating film can be enhanced.

Examples of the adhesion layer include layers comprising elements such as Si, Ge, Al, Ti, Cr, Zr, Nb, Mo, Hf, Ta, and W, and layers comprising compounds containing the elements and carbon.

The thickness of the adhesion layer is preferably 0.05 to 0.5 μm, more preferably 0.1 to 0.2 μm, from the viewpoint of adhesiveness.

[Embodiments of Decorative Article]

The decorative article of the present invention is not particularly limited if the decorative article includes a base and a black hard coating film which is formed on the base, and which comprises DLC, the hydrogen content of a surface, reverse to a surface closer to the base, of the black hard coating film is more than the hydrogen content of the surface, closer to the base, of the black hard coating film, and the hydrogen content of the surface, reverse to the surface closer to the base, of the black hard coating film is 30.0 to 75.0 atm %, as described above. Examples thereof include such embodiments as described below.

Embodiments A to D

Embodiments of the decorative article of the present invention include the decorative article 10 in which the black hard coating film 12 is formed on the base 11 as illustrated in FIG. 1, and more specifically include Embodiment A in which the hydrogen content in a black hard coating film is increased in a continuous and linear manner with increasing a distance from a base (see FIG. 5). Such embodiments also include an embodiment, such as Embodiment A', in which the hydrogen content in a black hard coating film is increased in a continuous and curved manner with increasing a distance from a base, and an embodiment, such as Embodiment B, in which the hydrogen content in a black hard coating film is increased in a discontinuous (intermittent) and stepwise manner with increasing a distance from a base (see FIG. 5). Such embodiments also include Embodiments C, C', and D which each include a region in which a hydrogen content is decreased in a continuous or discontinuous (intermittent) manner with increasing a distance from a base, and in which the hydrogen content is then increased in a continuous or discontinuous (intermittent) manner (see FIG. 5), based on Embodiments A, A', and B.

Furthermore, such embodiments also include embodiments each including a region in which a hydrogen content is increased in a discontinuous (intermittent) manner with increasing a distance from a base, based on Embodiments A, A', C, and C', and embodiments each including a region in which a hydrogen content is increased in a continuous manner with increasing a distance from a base, based on Embodiments B and D.

In each of the embodiments, both of a black color tone and high hardness and scratch resistance can be achieved because there is a region having a low hydrogen content and high hardness in a side, closer to the base, of the black hard coating film, and there is a region having a high hydrogen content and a black color tone above the region.

Embodiment E

Such embodiments of the decorative article of the present invention also include a decorative article 20 in which, as a black hard coating film 22, a low-hydrogen-content layer 23 and a gradient layer 26 are formed in this order from a side closer to abase 21 as illustrated in FIG. 2 (Embodiment E). In Embodiment E described above, the hydrogen content in the gradient layer 26 is increased (for example, in a continuous manner) with increasing a distance from the base, and the hydrogen content of a surface 201, closer to the gradient layer, of the low-hydrogen-content layer and the hydrogen content of a surface 202, closer to the low-hydrogen-content layer, of the gradient layer are equal (see FIG. 6).

As mentioned above, the formation of the low-hydrogen-content layer and the gradient layer results in the hardness and scratch resistance of the entire black hard coating film and in a black color tone without interference fringes. Furthermore, interference fringes are more inhibited from appearing, to result in a preferred appearance, because the hydrogen content of a surface, closer to the gradient layer, of the low-hydrogen-content layer and the hydrogen content of a surface, closer to the low-hydrogen-content layer, of the gradient layer are equal.

In Embodiment E, the hydrogen content of the low-hydrogen-content layer is preferably less than 30.0 atm %, more preferably 15.0 to 20.0 atm %, from the viewpoint of hardness and scratch resistance. From the viewpoint of a color tone, the hydrogen content of the gradient layer is preferably increased from the hydrogen content of the surface, closer to the gradient layer, of the low-hydrogen-content layer to 30.0 to 75.0 atm %, more preferably to 30.0 to 70.0 atm %, with increasing a distance from the base.

In Embodiment E, the thickness of the low-hydrogen-content layer is preferably 0.2 to 1.0 µm, more preferably 0.4 to 0.6 µm, from the viewpoint of hardness and scratch resistance. The thickness of the gradient layer is preferably 0.01 to 0.5 µm, more preferably 0.02 to 0.2 µm from the viewpoint of a color tone.

Embodiment F

Such embodiments of the decorative article of the present invention also include a decorative article 30 in which a black hard coating film 32 on a base 31 includes a first low-hydrogen-content layer 33 and a second low-hydrogen-content layer 34 as low-hydrogen-content layers and further includes an intermediate layer 35 comprising DLC (Embodiment F), as illustrated in FIG. 3. In Embodiment F described above, the first low-hydrogen-content layer 33, the intermediate layer 35, the second low-hydrogen-content layer 34, and a gradient layer 36 are formed in this order from a side closer to the base 31, the hydrogen content in the first low-hydrogen-content layer is less than the hydrogen content in the second low-hydrogen-content layer, and the hydrogen content in the intermediate layer and the hydrogen content in the gradient layer are increased (for example, in a continuous manner) with increasing a distance from the base (see FIG. 6). In Embodiment F described above, the hydrogen content of a surface 301, closer to the intermediate layer, of the first low-hydrogen-content layer and the hydrogen content of a surface 302, closer to the first low-hydrogen-content layer, of the intermediate layer are equal, the hydrogen content of a surface 303, closer to the second low-hydrogen-content layer, of the intermediate layer and the hydrogen content of a surface 304, closer to the intermediate layer, of the second low-hydrogen-content layer are equal, and the hydrogen content of a surface 305, closer to the gradient layer, of the second low-hydrogen-content layer and the hydrogen content of a surface 306, closer to the second low-hydrogen-content layer, of the gradient layer are equal.

As mentioned above, the formation of the low-hydrogen-content layer and the gradient layer results in the hardness and scratch resistance of the entire black hard coating film and in a black color tone without interference fringes. Furthermore, interference fringes are inhibited from appearing because the first low-hydrogen-content layer having a less hydrogen content than the second low-hydrogen-content layer absorbs more light, and the hardness and scratch resistance of the entire black hard coating film can be further improved because the second low-hydrogen-content layer having a more hydrogen content than the first low-hydrogen-content layer has higher hardness. In addition, interference fringes are more inhibited from appearing, to result in a preferred appearance, because the hydrogen contents of the boundaries of the corresponding layers are equal.

In Embodiment F, the hydrogen content of the first low-hydrogen-content layer is preferably less than 21.0 atm %, more preferably 10.0 to 20.0 atm %, from the viewpoint of inhibition of interference fringes, and the hydrogen content of the second low-hydrogen-content layer is more than the hydrogen content in the first low-hydrogen-content layer, and preferably 21.0 atm % or more and less than 30.0 atm %, more preferably 21.0 to 25.0 atm %, from the viewpoint of hardness and scratch resistance. The hydrogen content of the intermediate layer is increased from the hydrogen content of the first low-hydrogen-content layer to the hydrogen content of the second low-hydrogen-content layer with increasing a distance from the base. The hydrogen content of the gradient layer is preferably increased from the hydrogen content of the surface, closer to the gradient layer, of the second low-hydrogen-content layer to 30.0 to 75.0 atm %, more preferably to 30.0 to 70.0 atm %, with increasing a distance from the base from the viewpoint of a color tone.

In Embodiment F, the thickness of the first low-hydrogen-content layer is preferably 0.1 to 0.7 µm, more preferably 0.2 to 0.3 µm, from the viewpoint of inhibition of interference fringes, and the thickness of the second low-hydrogen-content layer is preferably 0.1 to 0.5 µm, more preferably 0.2 to 0.3 µm, from the viewpoint of hardness and scratch resistance. The thickness of the intermediate layer is preferably 0.05 to 0.5 µm, more preferably 0.1 to 0.2 µm, from the viewpoint of inhibition of interference fringes, and the thickness of the gradient layer is preferably 0.01 to 0.5 µm, more preferably 0.02 to 0.2 µm, from the viewpoint of a color tone.

Embodiment G

Such embodiments of the decorative article of the present invention also include an embodiment in which a black hard coating film 32 further includes an outermost surface layer 37 which is formed on a side, reverse to a side closer to a base, of a gradient layer, and which comprises DLC, in Embodiment F, as illustrated in FIG. 4 (Embodiment G). The hydrogen content in the outermost surface layer is preferably an amount of ±10.0 atm %, more preferably an amount of ±5.0 atm %, with respect to the hydrogen content of a surface 307, reverse to a surface closer to the base, of the gradient layer, and is still more preferably equal to the hydrogen content of the surface 307, reverse to the surface closer to the base, of the gradient layer. FIG. 6 shows a case in which the hydrogen content in the outermost surface layer is equal to the hydrogen content of the surface 307, reverse to the surface closer to the base, of the gradient layer.

The formation of such an outermost surface layer on a gradient layer results in a black color tone with higher decorativeness.

In Embodiment G, the thickness of the outermost surface layer is preferably 0.01 to 0.1 µm, more preferably 0.01 to 0.05 µm, from the viewpoint of a color tone.

Although the hydrogen contents of the gradient layers and the intermediate layers are increased in linear manners with increasing the distances from the bases in FIG. 6 used in the explanation of Embodiments E to G described above, it is also acceptable that the hydrogen contents are increased in curved manners, a linear region and a curved region are combined, and linear regions with different gradients are combined.

Specifically, the hydrogen contents of the gradient layers in Embodiments E to G described above are increased so that the absolute values of the inclinations of straight lines between points B and points C are greater than the absolute values of the inclinations of straight lines between points A and points B indicated in FIG. 6. The points A represent the hydrogen contents on the base surfaces, the points B represent the hydrogen contents of the surfaces, closer to the bases, of the gradient layers, and the points C represent the hydrogen contents of the surfaces, reverse to the surfaces closer to the bases, of the gradient layers.

Other Embodiment

Such embodiments include an embodiment in which an adhesion layer is formed between a base and a black hard coating film, in the embodiments mentioned above.

The film hardness of the decorative article of the present invention is typically HV 1000 or more, preferably HV 1200 to 1800, and scratch resistance is excellent.

<Method for Producing Decorative Article>

A method for producing a decorative article of the present invention is a method for producing the decorative article mentioned above, in other words, a method for producing a decorative article including a base and a black hard coating film which is formed on the base, and which comprises diamond-like carbon, the method including a black hard coating film formation step of forming the black hard coating film by a plasma CVD method. In the black hard coating film formation step, the black hard coating film is formed so that the hydrogen content of a surface, reverse to a surface closer to a base, of the black hard coating film is more than the hydrogen content of the surface, closer to the base, of the black hard coating film, and the hydrogen content of the surface, reverse to the surface closer to the base, of the black hard coating film is 30.0 to 75.0 atm %.

In the black hard coating film formation step, specifically, a negative voltage is applied to the base set in a vacuum apparatus, and gas containing raw materials is allowed to be plasma and to chemically react, and is then subjected to adsorption coating on the base, to form a coating film.

As the gas containing raw materials, a hydrocarbon gas such as methane, acetylene, or benzene is preferably used. As a result, the coating film comprising DLC which contains carbon and hydrogen can be formed.

The voltage applied to the base is typically 100.0 V to 5.0 kV. The hydrogen content of the black hard coating film can be controlled in the above-described range by appropriately setting the voltage based on time from the start of the formation of the coating film. For example, specifically, in the gradient and intermediate layers mentioned above, the hydrogen contents in the layers can be increased by appropriately reducing the voltage during the formation of the layers.

More specifically, a method in which a relationship between a voltage applied to a base and a hydrogen content is determined beforehand, and only the voltage is controlled in the case of an actual black hard coating film is preferably used for the hydrogen content. For a thickness, a method in which a film formation rate per unit time is determined beforehand, and only film formation time is controlled in the case of the actual black hard coating film is preferably used. The hydrogen content and thickness of the actual black hard coating film can be determined by resonant nuclear reaction analysis (NRA) and Rutherford backscattering spectrometry (RBS).

A physical vapor growth method such as a sputtering method, an arc method, or an ion plating method, or a chemical vapor growth method (CVD) such as an ionic vapor deposition method or an RF plasma CVD method is preferably used for allowing the other elements mentioned above to be contained in a black hard coating film.

For example, in order to allow, for example, Si to be contained in a DLC film using the ionic vapor deposition method which is one of the CVD methods, an organosilicon compound gas such as tetramethylsilane is mixed into a hydrocarbon gas such as methane, acetylene, or benzene, the mixture is introduced into a vacuum apparatus, the mixed gas is allowed to be plasma using an ion source, and a negative voltage is applied to a base, to form DLC containing Si on a base surface. In this technique, DLC containing boron, DLC containing fluorine, or the like can be formed by changing the gas mixed into the hydrocarbon gas into another gas.

In order to allow, for example, Cr to be contained in a DLC film using the sputtering method which is one of the PVD methods, Cr is sputtered by a DC sputtering method, to allow Cr to be contained in the DLC film, simultaneously with ionizing a hydrocarbon gas such as methane, acetylene, or benzene to form DLC on a base surface. Cr can also be evaporated to be contained in the DLC film by the arc method or the ion plating method other than the sputtering method. In this technique, DLC containing another element such as F, Si, Ge, B, Al, Ti, V, Ni, Zr, Nb, Mo, Hf, Ta, or W can be formed by changing the solid material to another solid.

In order to form an adhesion layer between a base and a black hard coating film, an adhesion layer formation step is performed prior to a black hard coating film formation step, and the above-described black hard coating film formation step is then performed on the base on which the adhesion layer is formed.

The adhesion layer formation step is a step of forming the adhesion layer on the base by a wet plating method or a dry plating method. Examples of the dry plating method include physical vapor deposition (PVD) methods such as a sputtering method, an arc method, an ion plating method, and an ion beam, and CVD. Of these, the sputtering method, the arc method, and the ion plating method are preferably used.

<Decorative Article>

Examples of the decorative article of the present invention include timepieces, necklaces, pendants, brooches, glasses, and the like. Part of each of them may be composed of the above-described decorative article, or the whole thereof may be composed of the above-described decorative article.

Such a timepiece may be any one of photovoltaic timepieces, thermoelectric generating timepieces, electric wave reception type self-correction timepieces, mechanical timepieces, and general electronic timepieces. Such a timepiece is produced by a known method using the above-described decorative article. In particular, a watch is an example of decorative articles which are easily scratched due to a rub with a shirt or to collision with a desk, a wall, or the like. By forming the decorative article of the present invention on such a timepiece, the timepiece can be inhibited from being scratched, to maintain its black color tone and appearance in very beautiful states, for many years.

On the basis of the above, the present invention relates to, for example, the following (1) to (8):

(1) A decorative article, including: a base; and a black hard coating film which is formed on the base, and which comprises diamond-like carbon, wherein a hydrogen content of a surface, reverse to a surface closer to the base, of the black hard coating film is more than a hydrogen content of the surface, closer to the base, of the black hard coating film; and the hydrogen content of the surface, reverse to the surface closer to the base, of the black hard coating film is 30.0 to 75.0 atm %.

According to such a decorative article, both of a black color tone and high hardness and scratch resistance can be achieved.

(2) The decorative article according to (1), wherein the black hard coating film includes a gradient layer comprising diamond-like carbon;

a hydrogen content in the gradient layer is increased (for example, in a continuous manner) with increasing a distance from the base; and a hydrogen content of a surface, reverse to a surface closer to the base, of the gradient layer is 30.0 to 75.0 atm %.

Such a decorative article, in which interference fringes on a black hard coating film are inhibited from being seen, has a preferred appearance.

(3) The decorative article according to (2), wherein the black hard coating film further includes a low-hydrogen-content layer which is formed in a portion closer to the base than the gradient layer, and which comprises diamond-like carbon; and a hydrogen content in the low-hydrogen-content layer is less than 30.0 atm %.

In such a decorative article, the hardness and scratch resistance of an entire black hard coating film are also high, and interference fringes are inhibited from being seen.

(4) The decorative article according to (3), wherein the low-hydrogen-content layer and the gradient layer are formed in this order from a side closer to the base; and a hydrogen content of a surface, closer to the gradient layer, of the low-hydrogen-content layer and a hydrogen content of a surface, closer to the low-hydrogen-content layer, of the gradient layer are equal.

(5) The decorative article according to (3), wherein the black hard coating film layer includes a first low-hydrogen-content layer and a second low-hydrogen-content layer as the low-hydrogen-content layer and further includes an intermediate layer comprising diamond-like carbon;

the first low-hydrogen-content layer, the intermediate layer, the second low-hydrogen-content layer, and the gradient layer are formed in this order from a side closer to the base;

a hydrogen content in the first low-hydrogen-content layer is less than a hydrogen content in the second low-hydrogen-content layer;

a hydrogen content in the intermediate layer is increased (for example, in a continuous manner) with increasing a distance from the base; and a hydrogen content of a surface, closer to the intermediate layer, of the first low-hydrogen-content layer and a hydrogen content of a surface, closer to the first low-hydrogen-content layer, of the intermediate layer are equal, a hydrogen content of a surface, closer to the second low-hydrogen-content layer, of the intermediate layer and a hydrogen content of a surface, closer to the intermediate layer, of the second low-hydrogen-content layer are equal, and a hydrogen content of a surface, closer to the gradient layer, of the second low-hydrogen-content layer and a hydrogen content of a surface, closer to the second low-hydrogen-content layer, of the gradient layer are equal.

In the decorative articles (4) and (5), the hardness and scratch resistance of entire black hard coating films are also higher, and interference fringes are more inhibited from being seen.

(6) The decorative article according to any one of (2) to (5), wherein the black hard coating film further includes an outermost surface layer which is formed on a side, reverse to a side closer to the base, of the gradient layer, and which comprises diamond-like carbon; and a hydrogen content in the outermost surface layer is an amount of ±10.0 atm % with respect to a hydrogen content of a surface, reverse to a surface closer to the base, of the gradient layer.

Such a decorative article results in a black color tone with higher decorativeness.

(7) The decorative article according to (1), wherein a hydrogen content in the black hard coating film is increased with increasing a distance from the base.

According to such a decorative article, both of a black color tone and high hardness and scratch resistance can be achieved.

(8) A method for producing a decorative article including a base and a black hard coating film which is formed on the base, and which comprises diamond-like carbon, the method including a black hard coating film formation step of forming the black hard coating film by a plasma CVD method, wherein in the black hard coating film formation step, the black hard coating film is formed so that a hydrogen content of a surface, reverse to a surface closer to the base, of the black hard coating film is more than a hydrogen content of the surface, closer to the base, of the black hard coating film, and the hydrogen content of the surface, reverse to the surface closer to the base, of the black hard coating film is 30.0 to 75.0 atm %.

According to such a method for producing a decorative article, such a decorative article in which both of a black color tone and high hardness and scratch resistance are achieved as mentioned above is obtained.

EXAMPLES

The present invention will be further specifically explained below based on examples. However, the present invention is not limited to the examples.

<Measurement Method>

[Spectral Reflectance and L*]

A spectral reflectance and L* were measured with a spectral colorimeter CM-2600d, manufactured by KONICA MINOLTA, INC.

[Hardness]

For film hardness, a nano-indentation hardness tester (H100, manufactured by FISCHER) was used. A Vickers indenter was used as a gauge head, held at a load of 5 mN for 10 seconds, and then unloaded, and the film hardness was calculated from the depth of the inserted Vickers indenter.

[RBS]

Measurement was performed with Pelletron 3SDH, manufactured by National Electrostatics Corporation.

[NRA]

Measurement was performed with RPEA 4.0 Dynamitron, manufactured by Radiation Dynamics, Inc.

<Relationship Between Bias and Hydrogen Content>

When DLC was formed on a base surface by an ionic vapor deposition method which is one of CVD methods, a bias applied to the base was varied in a stepwise fashion. A variation, in a film thickness direction, in the hydrogen content of a coating film obtained in such a manner was analyzed by NRA, to obtain a relationship between the bias and the hydrogen content (FIG. 7).

In each of Examples and Comparative Example, the above-described relationship between the bias and the hydrogen content was used to control the bias to form a black hard coating film, and it was considered that the coating film having a desired hydrogen content was formed.

<Relationship between Coating Film Formation Time and Film Thickness>

A coating film was formed on a base for a predetermined period of time on predetermined optional conditions, and the film thickness of the formed coating film was measured. Specifically, a mask was put on a partial region of a Si base surface, the film was formed, the mask was removed after the formation of the film, and the level difference between a mask region to which the film was not applied and a non-mask region to which the film was applied was measured to measure the film thickness. A tracer-type surface geometry measuring instrument Dektak6M manufactured by ULVAC was used for the measurement of the level difference. A film formation rate per unit time was obtained by dividing the obtained film thickness by the period of film formation time.

In each of Examples and Comparative Examples, the above-described film formation rate was used to control a period of film formation time to form the black hard coating film, and it was considered that the coating film having a desired film thickness was formed.

Example 1

In first treatment, a clean base (Si substrate and SUS substrate) was placed in a vacuum apparatus, and the interior of the apparatus was evacuated while a flat plate was heated to 120° C. by a heater mounted in the apparatus.

In subsequent treatment, an Ar gas as an inert gas and an acetylene gas as a source gas were introduced into the vacuum apparatus, the acetylene gas was decomposed by a plasma CVD method while a pressure in the apparatus was kept at 1.0 Pa, and a DLC layer was formed on the base. When the DLC layer was formed, a negative voltage applied to the base was intermittently reduced from 3 kV to 100 V from the early period of the film formation to the end of the film formation. In addition, a period of film formation time was adjusted so that the film thickness of the DLC layer was 0.75 μm.

After the formation of the DLC layer, the introduction of the acetylene gas and the Ar gas into the vacuum apparatus was stopped, cooling was performed while a vacuum in the vacuum apparatus was maintained, and the apparatus was then opened to the atmosphere to take out the base.

In such a manner, a decorative article having a structure including the base and the black hard coating film of 0.75 μm (in which the hydrogen content was increased in a stepwise manner from 20.0 atm % to 68.0 atm % with increasing a distance from the base) was produced as schematically illustrated in FIG. 8. The measurement results of a spectral reflectance are shown in FIG. 9, and the hardness of the black hard coating film and the measurement result of L* of the decorative article are listed in Table 1.

Example 2

First, treatment similar to the first treatment of Example 1 was performed, an Ar gas as an inert gas and an acetylene gas as a source gas were then introduced into the vacuum apparatus, the acetylene gas was decomposed by a plasma CVD method while a pressure in the apparatus was kept at 1.0 Pa, and DLC layers were formed on a base. When the DLC layers were formed, first, a layer of 0.6 μm was formed at a bias of 3 kV, and then, a bias of 3 kV was continuously reduced to 100 V to form a gradient layer having a film thickness of 0.2 μm. After the formation of the DLC layers, the introduction of the acetylene gas and the Ar gas into the vacuum apparatus was stopped, cooling was performed while a vacuum in the vacuum apparatus was maintained, and the apparatus was then opened to the atmosphere to take out the base.

In such a manner, a decorative article having a structure including the base, the low-hydrogen-content layer of 0.6 μm (hydrogen content=20.0 atm %), and the gradient layer of 0.2 μm (in which the hydrogen content was increased from 20.0 atm % to 68.0 atm % with increasing a distance from the base) was produced as schematically illustrated in FIG. 10. The measurement results of a spectral reflectance are shown in FIG. 11, and the hardness of the black hard coating film and the measurement result of L* of the decorative article are listed in Table 1.

Example 3

First, treatment similar to the first treatment of Example 1 was performed, an Ar gas as an inert gas and an acetylene gas as a source gas were then introduced into the vacuum apparatus, the acetylene gas was decomposed by a plasma CVD method while a pressure in the apparatus was kept at 1.0 Pa, and DLC layers were formed on a base. When the DLC layers were formed, first, a layer of 0.4 μm was formed at a bias of 3 kV, a bias of 3 kV was then continuously reduced to 1 kV to form an intermediate layer having a film thickness of 0.1 μm, a layer of 0.5 μm was then formed at a bias of 1 kV, and finally, a bias of 1 kV was continuously reduced to 100 V to form a gradient layer having a film thickness of 0.1 μm. After the formation of the DLC layers, the introduction of the acetylene gas and the Ar gas into the vacuum apparatus was stopped, cooling was performed while a vacuum in the vacuum apparatus was maintained, and the apparatus was then opened to the atmosphere to take out the base.

In such a manner, a decorative article having a structure including the base, the first low-hydrogen-content layer of 0.4 μm (hydrogen content=20.0 atm %), the intermediate layer of 0.1 μm (in which the hydrogen content was increased from 20.0 atm % to 24.0 atm % with increasing a distance from the base), the second low-hydrogen-content layer of 0.5 μm (hydrogen content=24.0 atm %), and the gradient layer of 0.1 μm (in which the hydrogen content was increased from 24.0 atm % to 68.0 atm % with increasing a distance from the base) was produced as schematically illustrated in FIG. 12. The measurement results of a spectral reflectance are shown in FIG. 13, and the hardness of the black hard coating film and the measurement result of L* of the decorative article are listed in Table 1.

Example 4

First, treatment similar to the first treatment of Example 1 was performed, an Ar gas as an inert gas and an acetylene gas as a source gas were then introduced into the vacuum apparatus, the acetylene gas was decomposed by a plasma CVD method while a pressure in the apparatus was kept at 1.0 Pa, and DLC layers were formed on a base. When the DLC layers were formed, first, a layer of 0.1 μm was formed at a bias of 5 kV, a bias of 5 kV was then continuously reduced to 1 kV to form an intermediate layer having a film thickness of 0.1 μm, a layer of 0.2 μm was then formed at a bias of 1 kV, and finally, a bias of 1 kV was continuously reduced to 100 V to form a gradient layer having a film thickness of 0.02 μm. After the formation of the DLC layers, the introduction of the acetylene gas and the Ar gas into the vacuum apparatus was stopped, cooling was performed while a vacuum in the vacuum apparatus was maintained, and the apparatus was then opened to the atmosphere to take out the base.

In such a manner, a decorative article having a structure including the base, the first low-hydrogen-content layer of 0.1 μm (hydrogen content=15.0 atm %), the intermediate layer of 0.1 μm (in which the hydrogen content was increased from 15.0 atm % to 24.0 atm % with increasing a distance from the base), the second low-hydrogen-content layer of 0.2 μm (hydrogen content=24.0 atm %), and the gradient layer of 0.02 μm (in which the hydrogen content was increased from 24.0 atm % to 68.0 atm % with increasing a distance from the base) was produced as schematically illustrated in FIG. 14. The measurement results of a spectral reflectance are shown in FIG. 15, and the hardness of the black hard coating film and the measurement result of L* of the decorative article are listed in Table 1.

Example 5

First, treatment similar to the first treatment of Example 1 was performed, an Ar gas as an inert gas and an acetylene gas as a source gas were then introduced into the vacuum apparatus, the acetylene gas was decomposed by a plasma CVD method while a pressure in the apparatus was kept at 1.0 Pa, and DLC layers were formed on a base. When the DLC layers were formed, first, a layer of 0.7 μm was formed at a bias of 5 kV, a bias of 5 kV was then continuously reduced to 1 kV to form an intermediate layer having a film thickness of 0.1 μm, a layer of 0.2 μm was then formed at a bias of 1 kV, a bias of 1 kV was continuously reduced to 100 V to form a gradient layer having a film thickness of 0.03 μm, and finally, a layer having a film thickness of 50 nm was formed at a bias of 100 V. After the formation of the DLC layers, the introduction of the acetylene gas and the Ar gas into the vacuum apparatus was stopped, cooling was performed while a vacuum in the vacuum apparatus was maintained, and the apparatus was then opened to the atmosphere to take out the base.

In such a manner, a decorative article having a structure including the base, the first low-hydrogen-content layer of 0.7 μm (hydrogen content=15.0 atm %), the intermediate layer of 0.1 μm (in which the hydrogen content was increased from 15.0 atm % to 24.0 atm % with increasing a distance from the base), the second low-hydrogen-content layer of 0.2 μm (hydrogen content=24.0 atm %), the gradient layer of 0.03 μm (in which the hydrogen content was increased from 24.0 atm % to 68.0 atm % with increasing a distance from the base), and the outermost surface layer of 50 nm (hydrogen content=68.0 atm %) was produced as schematically illustrated in FIG. 16. The measurement results of a spectral reflectance are shown in FIG. 17, and the hardness of the black hard coating film and the measurement result of L* of the decorative article are listed in Table 1.

Example 6

First, treatment similar to the first treatment of Example 1 was performed, an Ar gas as an inert gas and an acetylene gas as a source gas were then introduced into the vacuum apparatus, the acetylene gas was decomposed by a plasma CVD method while a pressure in the apparatus was kept at 1.0 Pa, and DLC layers were formed on a base. When the DLC layers were formed, first, a layer of 0.8 μm was formed at a bias of 5 kV, a layer of 0.2 μm was formed at a bias of 1 kV, and finally, a layer having a film thickness of 50 nm was formed at a bias of 100 V. After the formation of the DLC layers, the introduction of the acetylene gas and the Ar gas into the vacuum apparatus was stopped, cooling was performed while a vacuum in the vacuum apparatus was maintained, and the apparatus was then opened to the atmosphere to take out the base.

In such a manner, a decorative article having a structure including the base, the first low-hydrogen-content layer of 0.8 μm (hydrogen content=15.0 atm %), the second low-hydrogen-content layer of 0.2 μm (hydrogen content=24.0 atm %), and the high-hydrogen-content layer of 50 nm (hydrogen content=68.0 atm %) was produced as schematically illustrated in FIG. 18. The measurement results of a spectral reflectance are shown in FIG. 19, and the hardness of the black hard coating film and the measurement result of L* of the decorative article are listed in Table 1.

Comparative Example 1

First, treatment similar to the first treatment of Example 1 was performed, an Ar gas as an inert gas and an acetylene gas as a source gas were then introduced into the vacuum apparatus, the acetylene gas was decomposed by a plasma CVD method while a pressure in the apparatus was kept at 1.0 Pa, and a bias of 3 kV was applied to a base to form a DLC layer having a film thickness of 0.8 μm. After the formation of the DLC layer, the introduction of the acetylene gas and the Ar gas into the vacuum apparatus was stopped, cooling was performed while a vacuum in the vacuum apparatus was maintained, and the apparatus was then opened to the atmosphere to take out the base.

In such a manner, a decorative article having a structure including the base and the low-hydrogen-content layer of 0.8 μm (hydrogen content=20.0 atm %) was produced as schematically illustrated in FIG. 20. The measurement results of a spectral reflectance are shown in FIG. 21, and the hardness of the black hard coating film and the measurement result of L* of the decorative article are listed in Table 1.

TABLE 1

|  | Hardness | L* |
|---|---|---|
| Example 1 | ≥1000 Hv | 36 |
| Example 2 | ≥1000 Hv | 38 |
| Example 3 | ≥1000 Hv | 38 |
| Example 4 | ≥1000 Hv | 38 |
| Example 5 | ≥1000 Hv | 34 |
| Example 6 | ≥1000 Hv | 37 |
| Comparative Example 1 | ≥1000 Hv | 48 |

No interference color was seen in Examples 1 to 5 and Comparative Example 1 while an interference color was seen in Example 6.

The black hard coating films were produced using <relationship between bias and hydrogen content> and <relationship between coating film formation time and film thickness> determined beforehand in Examples 1 to 6 and Comparative Example 1, and the hydrogen content and thickness of the actually produced black hard coating film were measured by RBS measurement in Example 1 (FIG. 22). This actually measured value satisfied <relationship between bias and hydrogen content> and <relationship between coating film formation time and film thickness> described above. In FIG. 22, Si indicated by a dotted line shows the base, and a carbon content indicated by an alternate long and short dash line is decreased and a hydrogen content indicated by a continuous line is increased in response to a decrease in the bias from a base surface.

REFERENCE SIGNS LIST

10: Decorative article
11: Base
12: Black hard coating film
20: Decorative article
21: Base
22: Black hard coating film
23: Low-hydrogen-content layer
26: Gradient layer
201: Surface, closer to gradient layer, of low-hydrogen-content layer
202: Surface, closer to low-hydrogen-content layer, of gradient layer
30: Decorative article
31: Base
32: Black hard coating film
33: First low-hydrogen-content layer
34: Second low-hydrogen-content layer
35: Intermediate layer
36: Gradient layer
37: Outermost surface layer
301: Surface, closer to gradient layer, of first low-hydrogen-content layer
302: Surface, closer to first low-hydrogen-content layer, of intermediate layer
303: Surface, closer to second low-hydrogen-content layer, of intermediate layer
304: Surface, closer to intermediate layer, of second low-hydrogen-content layer
305: Surface, closer to gradient layer, of second low-hydrogen-content layer
306: Surface, closer to second low-hydrogen-content layer, of gradient layer
307: Surface, reverse to surface closer to base, of gradient layer

The invention claimed is:

1. An article comprising a decorative article,
the decorative article comprising: a base; and a black hard coating film which is formed on the base, and which comprises diamond-like carbon,
wherein a hydrogen content of a surface, reverse to a surface closer to the base, of the black hard coating film is more than a hydrogen content of the surface, closer to the base, of the black hard coating film; and the hydrogen content of the surface, reverse to the surface closer to the base, of the black hard coating film is 30.0 to 75.0 atm %, and
wherein the article comprising the decorative article is a timepiece, a necklace, a pendant, a brooch, or glasses.

2. The article comprising a decorative article according to claim 1, wherein
the black hard coating film comprises a gradient layer comprising diamond-like carbon;
a hydrogen content in the gradient layer is increased with increasing a distance from the base; and
a hydrogen content of a surface, reverse to a surface closer to the base, of the gradient layer is 30.0 to 75.0 atm %.

3. The article comprising a decorative article according to claim 2, wherein
the black hard coating film further comprises a low-hydrogen-content layer which is formed in a portion closer to the base than the gradient layer, and which comprises diamond-like carbon; and
a hydrogen content in the low-hydrogen-content layer is less than 30.0 atm %.

4. The article comprising a decorative article according to claim 3, wherein the low-hydrogen-content layer and the gradient layer are formed in this order from a side closer to the base; and a hydrogen content of a surface, closer to the gradient layer, of the low-hydrogen-content layer and a hydrogen content of a surface, closer to the low-hydrogen-content layer, of the gradient layer are equal.

5. The article comprising a decorative article according to claim 3, wherein
the black hard coating film layer comprises a first low-hydrogen-content layer and a second low-hydrogen-content layer as the low-hydrogen-content layer and further comprises an intermediate layer comprising diamond-like carbon;
the first low-hydrogen-content layer, the intermediate layer, the second low-hydrogen-content layer, and the gradient layer are formed in this order from a side closer to the base;
a hydrogen content in the first low-hydrogen-content layer is less than a hydrogen content in the second low-hydrogen-content layer;
a hydrogen content in the intermediate layer is increased with increasing a distance from the base; and
a hydrogen content of a surface, closer to the intermediate layer, of the first low-hydrogen-content layer and a hydrogen content of a surface, closer to the first low-hydrogen-content layer, of the intermediate layer are equal, a hydrogen content of a surface, closer to the second low-hydrogen-content layer, of the intermediate layer and a hydrogen content of a surface, closer to the intermediate layer, of the second low-hydrogen-content layer are equal, and a hydrogen content of a surface, closer to the gradient layer, of the second low-hydrogen-content layer and a hydrogen content of a surface, closer to the second low-hydrogen-content layer, of the gradient layer are equal.

6. The article comprising a decorative article according to claim 2, wherein
the black hard coating film further comprises an outermost surface layer which is formed on a side, reverse to a side closer to the base, of the gradient layer, and which comprises diamond-like carbon; and
a hydrogen content in the outermost surface layer is an amount of ±10.0 atm % with respect to a hydrogen content of a surface, reverse to a surface closer to the base, of the gradient layer.

7. The article comprising a decorative article according to claim 1, wherein a hydrogen content in the black hard coating film is increased with increasing a distance from the base.

8. The article comprising a decorative article according to claim 1, wherein the thickness of the black hard coating film is 0.4 to 3.0 μm.

9. A method for producing an article comprising a decorative article comprising a base and a black hard coating film which is formed on the base, and which comprises diamond-like carbon,
the method comprising a black hard coating film formation step of forming the black hard coating film by a plasma CVD method, wherein
in the black hard coating film formation step, the black hard coating film is formed so that a hydrogen content of a surface, reverse to a surface closer to the base, of the black hard coating film is more than a hydrogen content of the surface, closer to the base, of the black hard coating film, and the hydrogen content of the surface, reverse to the surface closer to the base, of the black hard coating film is 30.0 to 75.0 atm %,
wherein the article comprising the decorative article is a timepiece, a necklace, a pendant, a brooch, or glasses.

* * * * *